(12) United States Patent
Huang et al.

(10) Patent No.: US 6,475,870 B1
(45) Date of Patent: Nov. 5, 2002

(54) P-TYPE LDMOS DEVICE WITH BURIED LAYER TO SOLVE PUNCH-THROUGH PROBLEMS AND PROCESS FOR ITS MANUFACTURE

(75) Inventors: Chih-Feng Huang, Chu-Pei (TW); Kuo-Su Huang, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/910,158

(22) Filed: Jul. 23, 2001

(51) Int. Cl.⁷ .................... H01L 21/331; H01L 21/8222
(52) U.S. Cl. ........................................ 438/316; 438/413
(58) Field of Search ................................ 438/204, 236, 438/311, 316, 335, 350, 353, 356, 370, 413, 414, 416, 766

(56) References Cited

U.S. PATENT DOCUMENTS

| 5,517,046 A | 5/1996 | Hsing et al. ................. 257/336 |
| 5,525,824 A * | 6/1996 | Himi et al. .................. 257/370 |
| 5,852,314 A | 12/1998 | Depetro et al. ............. 257/343 |
| 5,940,700 A | 8/1999 | Galbiati et al. ............. 438/237 |
| 6,046,473 A | 4/2000 | Blanchard .................... 257/341 |
| 6,069,034 A | 5/2000 | Gregory ...................... 438/201 |
| 6,130,458 A * | 10/2000 | Takagi et al. ............... 257/351 |

* cited by examiner

Primary Examiner—David Nelms
Assistant Examiner—David Nhu
(74) Attorney, Agent, or Firm—George O. Saile; Stephen B. Ackerman

(57) ABSTRACT

P-type LDMOS devices have been difficult to integrate with N-type LDMOS devices without adding an extra mask because the former have been unable to achieve the same breakdown voltage as the latter due to early punch-through. This problem has been overcome by preceding the epitaxial deposition of N– silicon onto the P– substrate with an additional process step in which a buried N+ layer is formed at the surface of the substrate by ion implantation. This N+ buried layer significantly reduces the width of the depletion layer that extends outwards from the P– well when voltage is applied to the drain thus substantially raising the punch-through voltage.

11 Claims, 5 Drawing Sheets

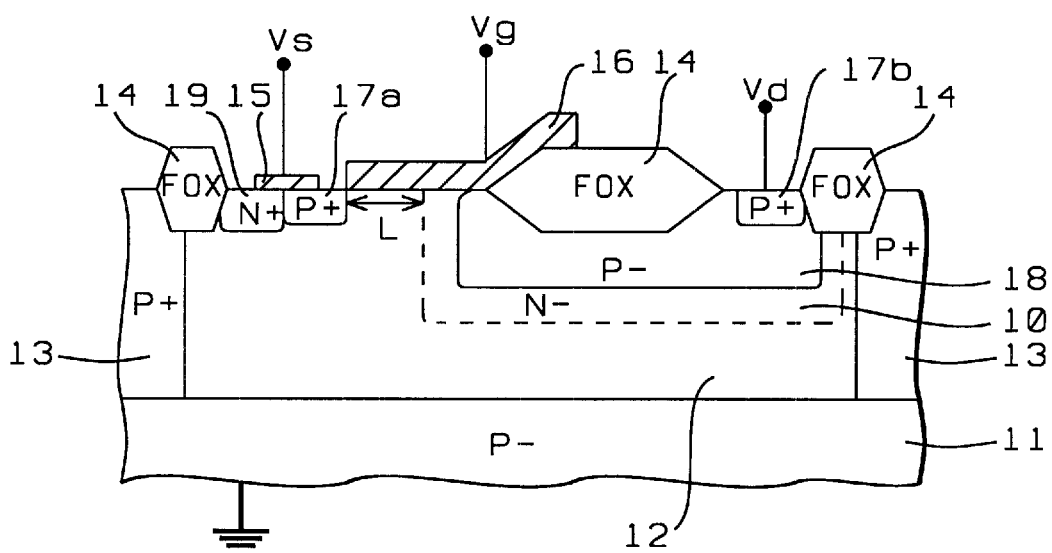
FIG. 1 – Prior Art

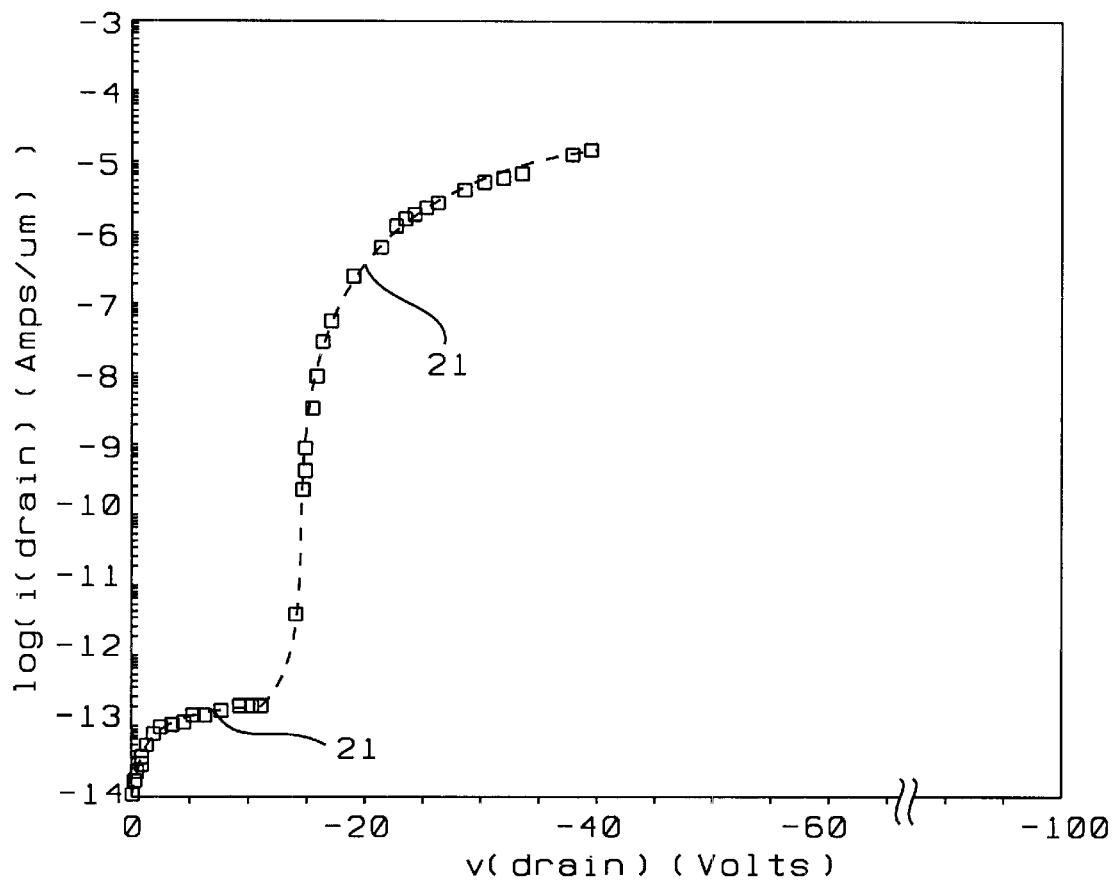
FIG. 2 - Prior Art
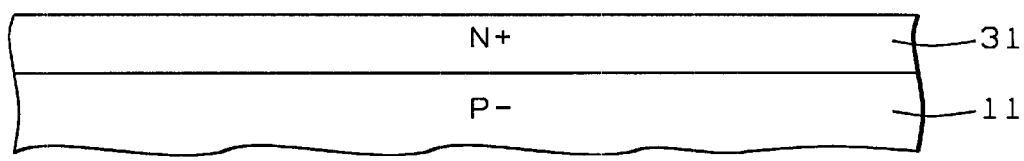
FIG. 3

P-TYPE LDMOS DEVICE WITH BURIED LAYER TO SOLVE PUNCH-THROUGH PROBLEMS AND PROCESS FOR ITS MANUFACTURE

FIELD OF THE INVENTION

The invention relates to the general field of lateral diffused MOS (LDMOS) devices with particular reference to increasing the punch-through voltage.

BACKGROUND OF THE INVENTION

An LDMOS device (Lateral Diffusion Metal Oxide Semiconductor) is basically a MOSFET fabricated using a double diffusion process with coplanar drain and source regions. The present invention is concerned with the particular case of P channel devices. In general, a P-type LDMOS device is difficult to integrate with processes for manufacturing N-type LDMOS devices without adding an extra mask. The main problem is that the P-type LDMOS cannot achieve the same breakdown voltage as its N-type counterpart because of early punch-through.

An N-epitaxial layer is always selected for the formation of LDMOS devices since the N-epi can be used as the drift region of the MOS drain to sustain high voltage. However the drain of a P-type LDMOS is formed by a P-implant process so a P-drain/N-epi/P-substrate structure is formed. When a high negative voltage is applied to the drain of a P-type LDMOS, punch-through to the P-substrate can occur very early.

This is illustrated in FIG. 1 which shows a typical structure of the prior art. N− body of silicon 12 (that typically has a resistivity between about 0.1 and 1 ohm-cm) is isolated from neighboring devices by P+ boundaries 13. P− well 18 extends downwards from the top surface and includes P+ drain 17b which is positioned to lie between two areas 14 of field oxide. Source 17a lies well outside P− well 18, also between two areas 14 of field oxide. Adjacent to the source is N+ area 19 to which is shorted thereto through metallic contact 15. Area 19 serves to provide bulk contact to N− body 12, providing it with a voltage bias.

The distance L seen in FIG. 1 defines the channel since it lies beneath polysilicon gate 16. There is also a layer of gate oxide beneath gate 16 which is not explicitly shown in this figure. It will be noted that L does not extend all the way to the boundary between regions 12 and 18. This is because, with the application of negative voltage $V_d$ to the drain, P− depletion region 10 extends outwards, effectively enlarging region 18, so P channel L does not have to extend all the way to the original region 18.

Thus the formation of depletion region 10 serves to reduce the on-resistance of the device. The down side of this, however, is that, with the application of relatively low drain voltage, depletion region 10 becomes thick enough to touch P− substrate 11 and punch-through occurs. This effect is illustrated in FIG. 2 which is a plot of drain current vs. drain voltage for a device of the type illustrated in FIG. 1. As can be seen, punch-through has occurred at about 10 volts, at which point the drain current is no longer controlled by the gate voltage. The present invention discloses how this problem may be overcome while continuing to retain compatibility with the simultaneous manufacture of N-channel devices and, particularly, without the need to introduce an additional mask into the manufacturing process.

A routine search of the prior art was performed with the following references of interest being found:

In U.S. Pat. No. 5,517,046, Hsing et al. disclose an N-channel LDMOS device with a 2 step doping N− and N+ in an epi layer. Their process and their structure differ from the present invention's process, theirs being a P channel LDMOS device whereas the present invention discloses an N channel device. As a consequence, the N+ buried layer that they teach, while improving on-resistance, has no significant effect on the breakdown voltage.

Other examples of LDMOS devices can be found in U.S. Pat. No. 5,940,700 (Galbiati et al.), U.S. Pat. No. 6,046,473 (Blanchard), and U.S. Pat. No. 6,069,034 (Gregory).

SUMMARY OF THE INVENTION

It has been an object of the present invention to provide a P-type LDMOS device having significantly higher punch-through voltage than similar devices of the prior art.

Another object has been to provide a process for manufacturing said device, said process being fully compatible with the manufacture of a N-type LDMOS device without requiring use of an additional mask.

These objects have been achieved by preceding the epitaxial deposition of N−silicon onto the P-substrate with an additional process step in which a buried N+ layer is formed at the surface of the substrate by ion implantation. This N+ buried layer significantly reduces the width of the depletion layer that extends outwards from the P− well when voltage is applied to the drain thus substantially raising the punch-through voltage.

BRIEF DESCRIPTION OF THE DRAWINGS

FIG. 1 is a cross-sectional view of a P-type LDMOS device of the prior art.

FIG. 2 is a current-voltage plot, for a device such as that illustrated in FIG. 1, to show where punch-through occurs.

FIG. 3 shows the starting point of the process of the present invention.

DESCRIPTION OF THE PREFERRED EMBODIMENTS

We will disclose the present invention through a description of a process for its manufacture. In the course of said description the structure of the present invention will also become apparent. Referring now to FIG. 3, the present invention begins with the provision of P− substrate 11 and then, as a key feature of the invention, using ion implantation (arsenic or antimony ions having a mean energy between about 80 and 120 kilovolts for a total dosage between about $1 \times 10^{14}$ and $1 \times 10^{15}$ ions per cc.), forming N+ buried layer 31 to a thickness between about 0.5 and 3 microns, said layer having a resistivity that is less than about 0.1 ohm-cm.

Figure 4:
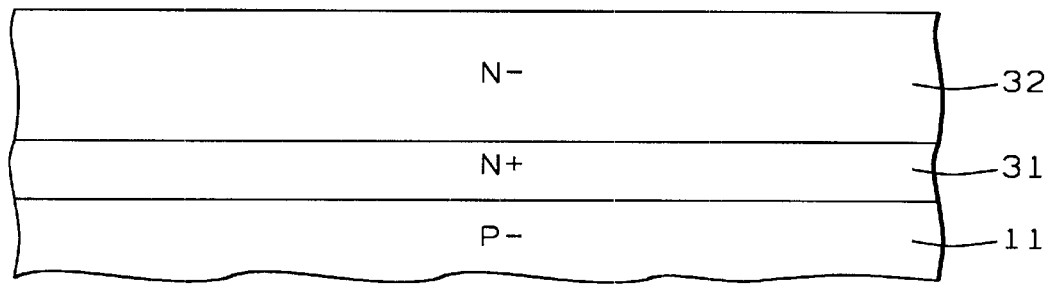
FIG. 4 shows the next, and crucial, step in the process of the present invention.

Referring next to FIG. 4, epitaxial layer 32 of N– silicon is deposited on the substrate's upper surface to a thickness between about 4 and 15 microns, said layer having a resistivity that is between about 0.1 and 1 ohm-cm. Our preferred process for performing the epitaxial depositions has been ASM, Endura, or Toshiba, but any process that yields high quality epitaxial silicon could have been used.

Figure 5:
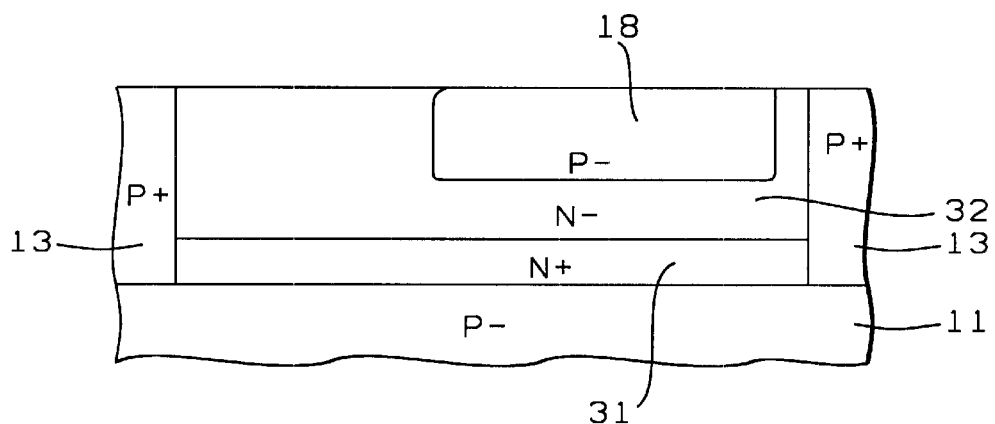
FIG. 5 shows the formation of a P− well in the epitaxial layer.

Once layer 32 is in place, manufacture of the device proceeds along conventional lines for a P channel device. As seen in FIG. 5, the next step is the formation of P+ junction isolation boundaries 13 that extends from the top surface of layer 32 all the way to P– substrate 11. Then, P– base region 18 is formed by means of ion implantation through a mask.

Figure 6:
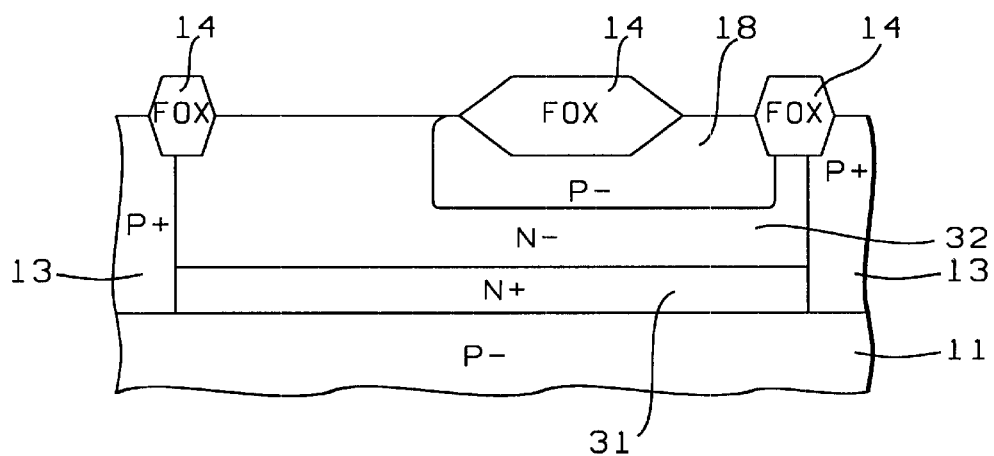
FIG. 6 shows the formation of regions of field oxide in the upper surface.

Referring now to FIG. 6, three areas 14 of field oxide are formed as shown, with the outer areas being contiguous with isolation boundaries 13 and the inner area being wholly within P– well 18.

Figure 7:
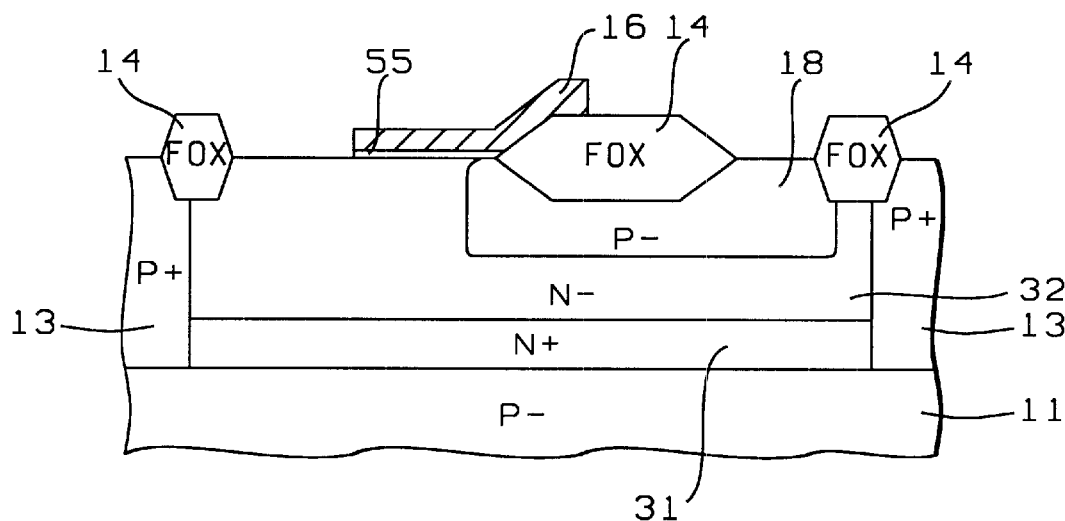
FIG. 7 shows the formation of the polysilicon gate.

As shown in FIG. 7, the next step is the deposition of layer 55 of gate oxide which is over-coated with polysilicon, the latter being patterned and etched (together with any unprotected gate oxide) to form gate pedestal 16.

Figure 8:
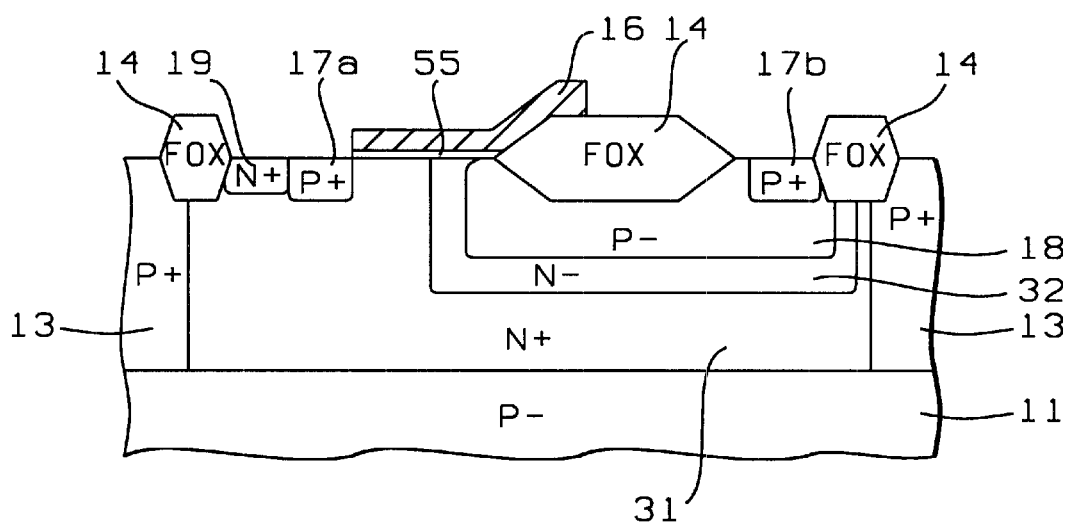
FIG. 8 shows the formation of source and drain regions for the device.

Referring now to FIG. 8, N+ region 19 is formed by ion implantation through a mask. This is followed by a second ion implantation through a mask, to form P+ source region 17a and P+ drain region 17b.

Figure 9:
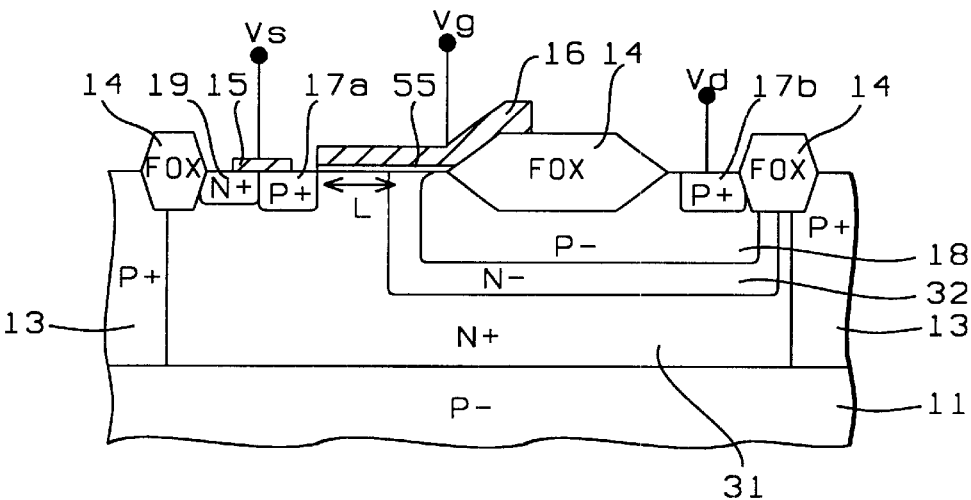
FIG. 9 is a cross-sectional view of the LDMOS device that is the end product of the process of the present invention.

As illustrated in FIG. 9, the process ends with the formation of metallic source and drain contacts, including shorting bar 15 which was discussed earlier. Not explicitly shown is a layer of dielectric on which the metal contacts sit.

The function of the additional N+ layer 31 can now be understood by referring back to FIG. 1. As discussed earlier, when negative voltage is applied to drain 17b depletion layer 10 forms and grows, effectively increasing the size of 18. When sufficient voltage is applied to cause 18 and 11 to make electrical contact, punch-through occurs. When the buried N+ layer 31 is placed between 11 and 18, growth of the depletion layer as a function of voltage is greatly reduced once 18 penetrates 31, thus substantially raising the punch-through voltage.

Figure 10:
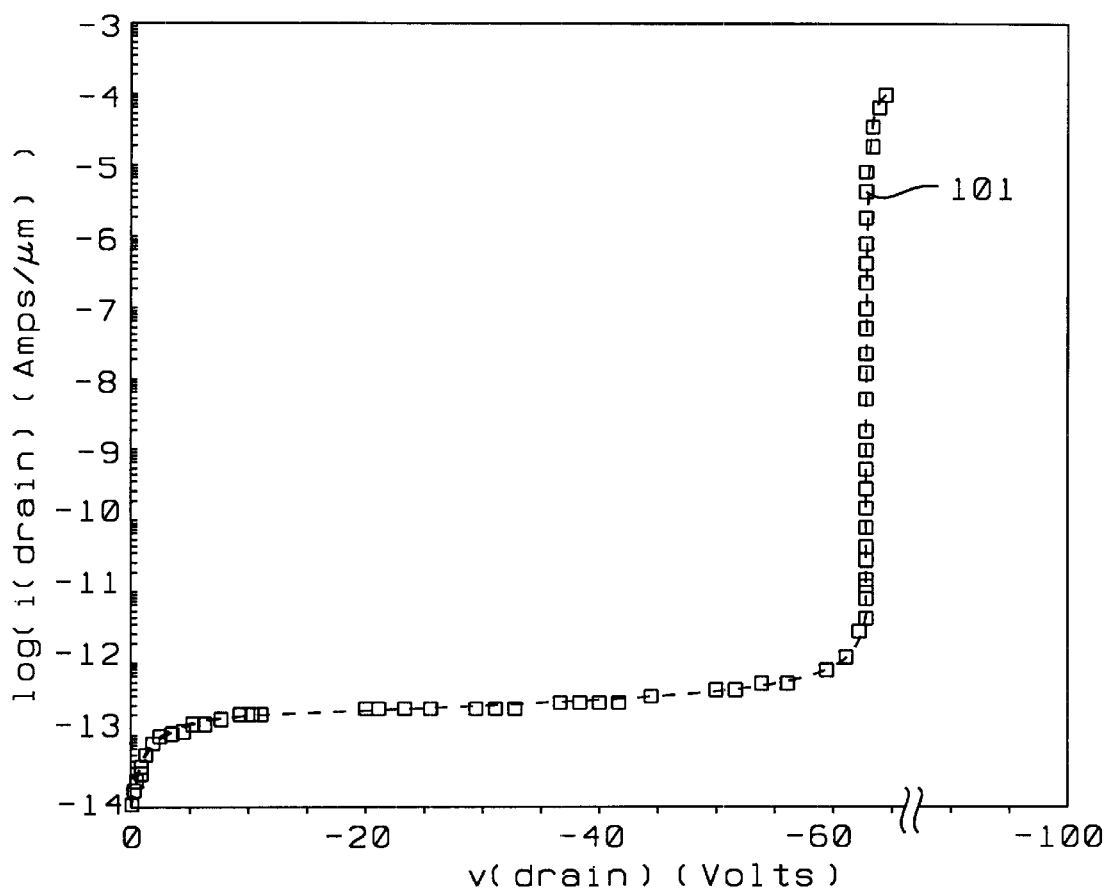
FIG. 10 is a current-voltage plot, showing where punch-through occurs in a device made according to the teachings of the present invention.

Confirmation of the effectiveness of the present invention was obtained by replotting the I-V curve, as shown in FIG. 10. As can be seen by an examination of curve 101, punch-through does not occur until about 70 volts, representing an improvement of about a factor of 5 over the prior art.

While the invention has been particularly shown and described with reference to the preferred embodiments thereof, it will be understood by those skilled in the art that various changes in form and details may be made without departing from the spirit and scope of the invention.

What is claimed is:

1. A process for manufacturing an LDMOS device, comprising the sequential steps of:

providing a P– substrate having a surface;

forming a N+ buried layer that extends downwards from said surface to a depth;

forming an epitaxial layer of N– silicon that extends upwards from said substrate surface;

forming a P– base region in the epitaxial layer;

outside said base region, forming a P+ source and a polysilicon gate located between said source and said base region; and in the base region, forming a P+ drain.

2. The process described in claim 1 wherein the epitaxial layer has a resistivity between about 0.1 and 1 ohm-cm.

3. The process described in claim 1 wherein the depth of the N+ buried layer is between about 0.5 and 3 microns.

4. The process described in claim 1 wherein the N+ buried layer has a resistivity less than about 0.1 ohm-cm.

5. The process described in claim 1 wherein the epitaxial layer is deposited to a thickness between about 4 and 15 microns.

6. A process for manufacturing an LDMOS device, comprising the sequential steps of:

providing a P– substrate having a surface;

forming a N+ buried layer that extends downwards from said surface;

forming an epitaxial layer of N– silicon, having an upper surface, that extends upwards from said substrate surface;

forming a P+ base region that extends downwards from said upper surface into the epitaxial layer;

forming a P+ junction isolation boundary that extends from said upper surface to the P-substrate;

forming first and second outer areas of field oxide, each touching an isolation boundary, and an inner area of field oxide wholly within the P– base region such that the first outer area is separated from said inner area by a first gap, the second outer area is separated from said inner area by a second gap, and the first gap is wider than the second gap;

on said upper surface, in the first gap, forming a layer of gate oxide;

on said layer of gate oxide, depositing a layer of polysilicon;

patterning said polysilicon, and all gate oxide not protected therewith, to form a gate pedestal;

by ion implantation through a mask, forming a N+ region that is contiguous with the first outer area and that extends downwards from said upper surface;

by ion implantation through a mask, forming a P+source region, that is contiguous with said N+ region, and a P+ drain region located in the second gap, both P+ regions extending downwards from said upper surface; and forming metallic source, gate, and drain contacts.

7. The process described in claim 6 wherein the epitaxial layer has a resistivity between about 0.1 and 1 ohm-cm.

8. The process described in claim 6 wherein the epitaxial layer is deposited to a thickness between about 4 and 15 microns.

9. The process described in claim 6 wherein the N+ buried layer has a resistivity less than about 0.1 ohm-cm.

10. The process described in claim 6 wherein the N+ buried layer is deposited to a thickness between about 0.5 and 3 microns.

11. The process described in claim 6 wherein said P– base region has a thickness between about 2 and 4 microns.

* * * * *